(12) United States Patent
Tailliet et al.

(10) Patent No.: US 10,186,320 B2
(45) Date of Patent: Jan. 22, 2019

(54) METHOD FOR READING AN EEPROM AND CORRESPONDING DEVICE

(71) Applicant: STMicroelectronics (Rousset) SAS, Rousset (FR)

(72) Inventors: François Tailliet, Fuveau (FR); Marc Battista, Allauch (FR); Victorien Brecte, Aix-en-Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/659,891

(22) Filed: Jul. 26, 2017

(65) Prior Publication Data

US 2017/0323684 A1  Nov. 9, 2017

Related U.S. Application Data

(62) Division of application No. 15/183,515, filed on Jun. 15, 2016, now Pat. No. 9,779,825.

(30) Foreign Application Priority Data

Nov. 3, 2015  (FR) ...................................... 15 60515

(51) Int. Cl.
| | |
|---|---|
| *G11C 7/00* | (2006.01) |
| *G11C 16/26* | (2006.01) |
| *G11C 7/06* | (2006.01) |
| *G11C 16/04* | (2006.01) |
| *G11C 16/24* | (2006.01) |

(52) U.S. Cl.
CPC .............. *G11C 16/26* (2013.01); *G11C 7/067* (2013.01); *G11C 16/0433* (2013.01); *G11C 16/24* (2013.01)

(58) Field of Classification Search
CPC ......... G11C 7/062; G11C 7/065; G11C 16/24; G11C 16/0433; G11C 16/26
See application file for complete search history.

(56) References Cited

U.S. PATENT DOCUMENTS 5,936,888 A * 8/1999 Sugawara .............. G11C 16/28
  365/185.2
9,025,386 B1  5/2015 Iyer et al.
(Continued)

FOREIGN PATENT DOCUMENTS

WO   2009051960 A   4/2009

*Primary Examiner* — Tuan T Nguyen
(74) *Attorney, Agent, or Firm* — Slater Matsil, LLP

(57) ABSTRACT

A read amplifier of a memory device has two current generators, an inverter, and five transistors. The inverter is connected to the second current generator. The first transistor has a gate connected to the read amplifier, a drain connected to the first current generator, and a source connected to a reference ground. The second transistor has a gate connected to the first current generator, a drain connected to a reference voltage, and a source connected to the gate of the first transistor. The third transistor has a drain connected to the first current generator and a source connected to the reference ground. The fourth transistor has a gate connected to the first current generator, a drain connected to the second current generator, and a source connected to the reference ground. The fifth transistor has a drain connected to the second current generator and a source connected to the reference voltage.

20 Claims, 2 Drawing Sheets

(56) References Cited

U.S. PATENT DOCUMENTS

| | | |
|---|---|---|
| 9,082,500 B1 | 7/2015 | Ku |
| 2008/0062762 A1 | 3/2008 | Doyle |
| 2016/0071594 A1 | 3/2016 | Paudel et al. |
| 2016/0180948 A1* | 6/2016 | Tanabe ............... G11C 16/0475 |
| | | 365/185.21 |
| 2017/0076791 A1* | 3/2017 | Takahashi .......... G11C 13/0004 |

* cited by examiner

METHOD FOR READING AN EEPROM AND CORRESPONDING DEVICE

CROSS-REFERENCE TO RELATED APPLICATIONS

This application is a divisional of U.S. patent application Ser. No. 15/183,515, filed on Jun. 15, 2016, which claims priority to French Patent Application No. 1560515, filed on Nov. 3, 2015, which applications are hereby incorporated herein by reference.

TECHNICAL FIELD

The present invention relates generally to memories, and in particular embodiments, to a system and method to read non-volatile memories of the electrically erasable programmable read-only memory (EEPROM) type.

BACKGROUND

In EEPROM memories, the logical value of a bit is stored in a memory cell, comprising a state transistor and a selection transistor.

The state transistor is generally a floating-gate transistor, comprising a control gate and a floating gate, and the information is expressed as a function of the charge on the floating gate. Typically, a negative charge on the floating gate corresponds to a state referred to as "erased" (the logical value of the bit stored is, for example, "0"), whereas as positive charge on the floating gate corresponds to a state referred to as "programmed" (the logical value of the stored bit is, for example, "1").

Generally, the selection transistor allows the access to the state transistor to be controlled. Its source is connected to the drain of the state transistor, and the source of the state transistor is connected to a source line.

SUMMARY

In accordance with an embodiment, a read amplifier in a memory device has two current generators, an inverter, and five transistors. An input of the inverter is connected to an output of the second current generator. The first transistor has a gate node connected to an input node of the read amplifier, a drain node connected to an output of the first current generator, and a source node connected to a reference ground. The second transistor has a gate node connected to the output of the first current generator, a drain node connected to a reference voltage, and a source node connected to the gate node of the first transistor. The third transistor has a drain node connected to the output of the first current generator and a source node connected to the reference ground. The fourth transistor has a gate node connected to the output of the first current generator, a drain node connected to the output of the second current generator, and a source node connected to the reference ground. The fifth transistor has a drain node connected to the output of the second current generator and a source node connected to the reference voltage.

In accordance with another embodiment, a memory device has a memory plane, a read amplifier, and a controller. The memory plane has a column of memory cells, a plurality of bit lines, and a plurality of word lines. The read amplifier is configured to read the memory cells. The controller is configured to pre-charge the input node of the read amplifier to a pre-charge voltage. The controller is also configured to select a bit line and a word line associated with a memory cell of the column of memory cells. Additionally, the controller is configured to apply a source voltage higher than the pre-charge voltage to a source of a floating gate transistor of the memory cell to generate a read current flow from the memory cell to an input node of the read amplifier.

In accordance with yet another embodiment, a method for reading a memory cell by a read amplifier is disclosed. A word line and a bit line of the memory cell are selected. The input node of the read amplifier and the bit line are pre-charged to a pre-charge voltage. A source voltage higher than the pre-charge voltage is applied to a source node of a floating gate transistor of the memory cell, where a current flows from the memory cell to the read amplifier in accordance with the applying the source voltage. The read amplifier then reads a logic value of a bit stored in the memory cell.

One embodiment provides a method for reading a memory cell of a memory plane of a memory of the electrically erasable programmable read-only memory (EEPROM) type. The word line and of the bit line to which the memory cell belongs are selected and the content of the cell is read via a read amplifier. One input of the read amplifier is connected to the bit line and pre-charged at a pre-charge voltage. During the read operation, a source voltage higher than the pre-charge voltage is applied to the source of the floating-gate transistor of the cell. A read current flows from the cell towards the input of the read amplifier and then flows through a programmed cell.

A memory device of the electrically erasable programmable read-only memory (EEPROM) type comprises a memory plane of memory cells. A read circuit comprises a read amplifier, one input of which is configured so as to be pre-charged at a pre-charge voltage. A controller is configured to select a word line and a bit line to which a cell belongs, so as to read the content of the cell via the read amplifier whose input is connected to the selected bit line. The controller is configured to apply a source voltage that is higher than the pre-charge voltage to the source of the floating-gate transistor of the cell. A read current flows from the cell towards the input of the read amplifier and then flows through a programmed cell.

BRIEF DESCRIPTION OF THE DRAWINGS

Other advantages and features of the invention will become apparent upon examining the detailed description of non-limiting embodiments and the appended drawings in which.

DETAILED DESCRIPTION OF ILLUSTRATIVE EMBODIMENTS

Figure 1:
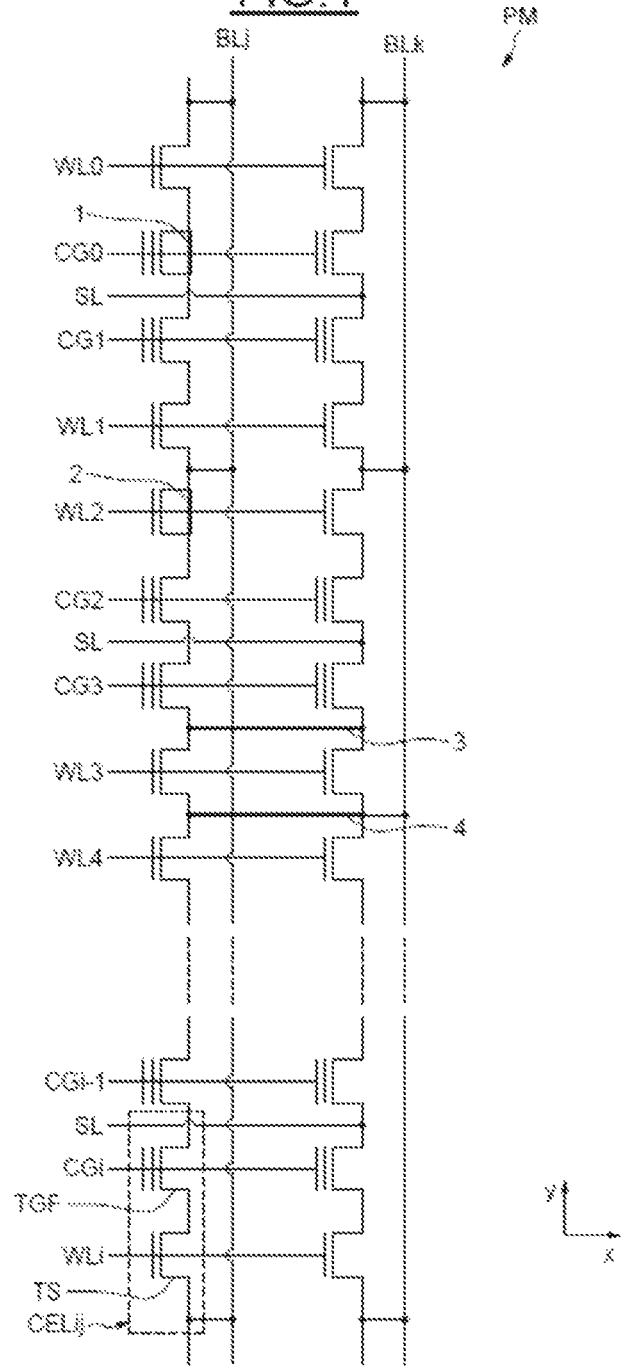
FIG. 1 illustrates one pattern of the structure of a memory plane of a memory of the EEPROM type.

A plurality of memory cells can be distributed as a matrix in a memory plane. One periodic pattern of a memory plane is shown in FIG. 1. In this case, the memory cells are non-volatile memories of the electrically erasable programmable read-only memory (EEPROM) type.

The access to a given memory cell (CELij) is achieved by decoding the memory plane (PM). Each gate of the selection transistors (TS) is connected to a word line (WLi) which runs in the X direction of the memory plane, and each drain of the selection transistors (TS) is connected to a bit line (BLj) which runs in the Y direction of the memory plane. The source lines (SL) are generally parallel to the word lines (WLi).

Generally, the bit lines are grouped into columns each comprising M bit lines. The memory cells of the same word line connected to the M bit lines of a column form a memory word allowing M bits to be stored.

The control gates of the state transistors (TGF) of the memory cells of a memory word, situated in a given column at the intersection with the row i, are controlled by the same control signal (CGi), as shown in FIG. 1.

Thus, in order to read a data value stored by a memory cell, an input of a read amplifier is pre-charged at a pre-charge voltage. Then, a conventional decoding of the memory plane is carried out in such a manner as to select the memory cell. The bit line is then pre-charged to the same voltage level as that of the input of the read amplifier, typically around 1V.

The pre-charge is halted and the decoded cell (selected) may be read by means of the read amplifier; the source line is grounded. An erased cell does not allow the current to flow and the bit line remains at the pre-charged potential. A programmed cell is conducting and allows the current to flow, resulting in a voltage drop on the bit line. The variation of the voltage is subsequently converted by the read amplifier into a logical value corresponding to the logical value of the bit stored in the selected memory cell.

There exists a constant need to increase the quantity of memory cells of a memory plane, in particular by reduction of the surface area occupied by a memory cell. For reduced lengths, current leaks (referenced 1 and 2 in FIG. 1) in the selection and non-selected state transistors can occur notably because of a "short-channel effect." This is because a lowering of the potential barrier between the drain and the source takes place due to the extension of the space-charge region which comes close to the source, an effect which is more marked the shorter the channels. This barrier lowering results in the current leaks. This effect leads to current flowing from the bit line towards the source line, usually connected to ground, through the non-selected memory cells. The leaks associated with short-channel effects in the state transistors lead to instabilities in the read currents of the selected cells. The leaks associated with short channel effects in the selection transistors mean that the bit-line current is equal to the read current of the selected cell, increased by the leakage currents of the selection transistors of non-selected cells, placed in series with their corresponding state transistors. These leakage currents therefore depend on the logical state of the non-selected cells and are unpredictable. The reduction in the size of the memory cells in the Y direction is thus limited by the appearance of the current leaks associated with short-channel effects in the state transistors and the selection transistors.

On the other hand, the selection transistors of neighboring bit lines may have source and drain regions that are close, forming structures of the N/P/N type, typically isolated by shallow isolation trenches. For reduced dimensions, it is then possible for current leaks 3, 4 to bypass the isolation trenches. The current of the bit line is then also modified and can lead to read errors. The reduction in the size of the memory cells in the X direction is thus limited by the appearance of current leaks 3, 4 between neighboring bit lines. The current solutions with regard to read methods for reducing the current leaks do not allow the leaks associated with short-channel effects in the state and selection transistors to be prevented, and they do not handle well the leaks from one bit line to another.

According to one embodiment, a method is provided for reading a memory cell of the EEPROM type aiming to eliminate as far as possible the potential current leaks by short-channel effect in the state and selection transistors of the memory cells, together with the potential current leaks by diffusion of electrons between neighboring bit lines. Thus, the method according to this embodiment notably allows memory cells with smaller dimensions to be formed and thus to increase the structural compactness of the memory planes of the memories of the EEPROM type.

According to one aspect, a method is provided for reading a memory cell of a memory plane of a memory of the EEPROM type, comprising a selection of the word line and of the bit line to which the memory cell belongs, and a reading of the content of the cell via a read amplifier, one input of which is connected to the bit line and pre-charged at a pre-charge voltage.

According to a general feature of this aspect, during the read operation, a source voltage higher than the pre-charge voltage is applied to the source of the floating-gate transistor of the cell, a read current flowing from the cell towards the input of the read amplifier then flowing through a programmed cell.

In other words, for a programmed cell, hence conducting, the read current flows in the opposite direction with respect to the prior art. The potential barrier between the N/P/N junctions of the cells situated on neighboring bit lines is increased by virtue of the reverse biasing of the source. The transfer of electrons is then virtually impossible and the leakage currents can be reduced by several orders of magnitude.

The memory cell can comprise a selection transistor whose source is connected to the drain of the floating-gate transistor, whose gate is connected to the word line and whose drain is connected to the input of the read amplifier via an auxiliary transistor configured for selecting the bit line, the substrates of the selection transistor and of the floating-gate transistor being connected to ground. Thus, the voltage applied to the branches from which the leaks originate is always positive, and a "substrate effect" appears. The substrate effect leads to a reduction in the leaks by increasing the potential barrier between source and drain of a transistor and between two closely-spaced bit lines.

According to one embodiment, and in the case of reading an erased cell, the voltage present at the input of the read amplifier is prevented from going below the pre-charge voltage. It is indeed advantageous to keep the voltage at the input of the read amplifier positive in order to reduce, or even eliminate, the current leaks, in particular in the case of reading an erased cell, which has the tendency to make the voltage on the bit line drop. The potential of the drain of an erased cell is the lowest potential applied to a diffusion N in the memory plane. If it is strictly positive, then all the diffusions N in the memory plane are at a strictly positive potential and the current leaks are consequently greatly reduced by substrate effect.

According to one embodiment, the pre-charge voltage is equal to a threshold voltage of an MOS transistor, the source voltage then being higher than the threshold voltage of a MOSFET transistor.

According to another aspect of the invention, a memory device of the EEPROM type, comprising a memory plane of memory cells, a read circuit comprising a read amplifier, one input of which is configured so as to be pre-charged at a pre-charge voltage, and a controller configured for selecting a word line and a bit line to which a cell belongs, so as to read the content of the cell through the read amplifier whose input is connected to the selected bit line.

According to a general feature of this other aspect, the controller is configured to apply to the source of the floating-gate transistor of the cell a source voltage higher than the pre-charge voltage, a read current flowing from the cell towards the input of the read amplifier then flows through a programmed cell. The cell can comprise a selection transistor whose source is connected to the drain of the floating-gate transistor, whose gate is connected to the word line and whose drain is connected to the input of the read amplifier via an auxiliary transistor configured for selecting the bit line, the substrates of the selection transistor and of the floating-gate transistor being connected to ground.

The read amplifier is advantageously configured for drawing a current from the drain of the selection transistor to ground, this tending to make the drain voltage of the selection transistor of an erased cell tend towards 0. The pre-charge is then aimed at preventing this voltage from falling below a certain minimum value in order to provide the substrate effect.

In other words, according to one embodiment, the read amplifier is configured for preventing the voltage present at the input of the read amplifier from falling below the pre-charge voltage, in the case of reading an erased cell. The read amplifier can be configured so that the pre-charge voltage is equal to a threshold voltage of a MOSFET transistor.

According to one embodiment, the read amplifier comprises a feedback loop containing a first MOSFET transistor in common source configuration whose drain is connected to the input of a second MOSFET transistor in source follower configuration, whose source is connected to the gate of the first MOSFET transistor and to the input of the read amplifier; the feedback loop is thus configured to prevent the voltage present at the input of the read amplifier from falling below the pre-charge voltage, which is moreover equal to the threshold voltage of the first MOSFET transistor. The bit line is connected to the source of the transistor in source follower configuration. The read amplifier comprises a current source imposing a current to ground on the pre-charge loop/bit-line assembly.

The various aspects and embodiments of the invention allow memory cells to be read while greatly reducing the current leaks, rendering possible a decrease in the surface area of the memory cells and thus an implementation of memory planes that are more compact than the current implementations.

Figure 2:
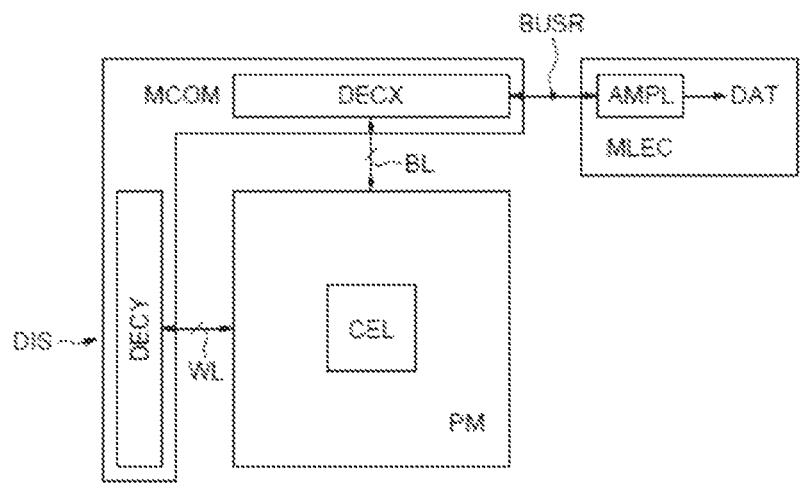
FIG. 2 illustrates a memory device of the EEPROM type.

FIG. 2 illustrates a memory device (DIS) of the EEPROM type according to one embodiment of the invention. Elements that are not needed for the description and for the understanding of the invention have purposely not been shown. The device (DIS) comprises a memory plane (PM) of memory cells (CEL), with a structure similar to the structure described by FIG. 1, notably comprising bit lines (BL) and word lines (WL). A controller (MCOM), comprising row decoders (DECX) and column decoders (DECY), manages the access to the memory cells (CEL) by selecting the corresponding bit line (BL) and word line (WL).

Thus, a selected cell is connected via a node (BUSR) to read circuit (MLEC), notably to the input of a read amplifier (AMPL) whose output delivers a logical value (DAT) corresponding to the logical value of the bit stored in the selected memory cell.

Figure 3:
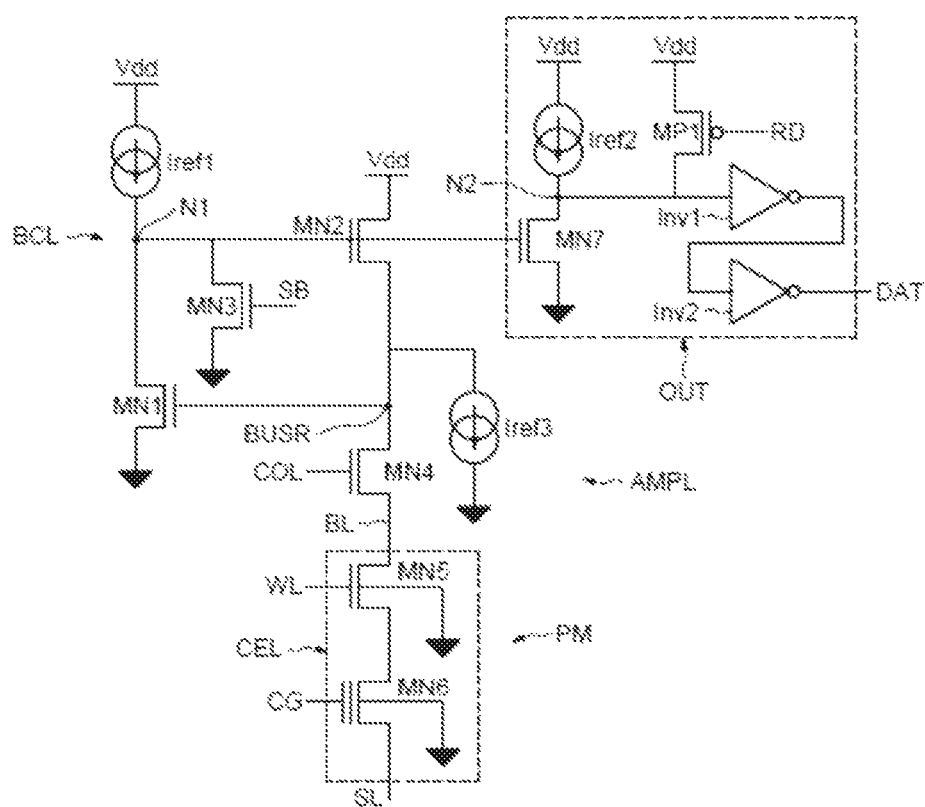
FIG. 3 illustrates in detail the various circuits of the memory device.

FIG. 3 shows, more precisely, one example of the various circuits in FIG. 2, in particular the read amplifier (AMPL). A cell (CEL) of a memory plane (PM) comprising a selection transistor (MN5) and a floating-gate state transistor (MN6) is notably shown. A bit line (BL) is connected to the drain of the selection transistor (MN5), a word line (WL) is connected to the gate of the selection transistor (MN5), a control line (CG) is connected to the control gate of the state transistor (MN6) and a source line (SL) is connected to the source of the state transistor (MN6). The substrates of the selection transistor (MN5) and state transistor (MN6) are connected to ground. A transistor (MN4) controlled on its gate by a signal (COL) connects the bit line (BL) to the input node (BUSR) of the read amplifier (AMPL). The transistor (MN4) is an element of the controller (MCOM) allowing a bit line of the memory plane to be selected, as a function of the signal (COL) produced by the controller (MCOM).

The read amplifier (AMPL) comprises an output stage (OUT) and a feedback loop (BCL) connected to the input node (BUSR) of the read amplifier (AMPL). The feedback loop (BCL) notably comprises a first MOSFET transistor of the N type (MN1) and a second MOSFET transistor of the N type (MN2). The source of the transistor (MN1) is connected to ground, the drain of the transistor (MN1) is connected to a current generator (Iref1) via a node (N1), and the gate of the transistor (MN1) is connected to the input node (BUSR) of the read amplifier (AMPL). The current (Iref1) is generated in such a manner as to be positive incoming into the drain of the transistor (MN1).

The gate of the transistor (MN2) is connected to the node (N1), the drain of the transistor (MN2) is connected to a stable positive voltage source (Vdd), and the source of the transistor (MN2) is connected to a stable current source (Iref3) and to the input node (BUSR). The current (Iref3) is generated in such a manner as to be positive outgoing from the source of the transistor (MN2).

In other words, the transistor (MN1) is configured in common source mode and its drain is connected to the gate of the transistor (MN2) configured in source follower mode, the source of the transistor (MN2) being fed back onto the gate of the transistor (MN1). The bit line is connected, via the transistor (MN4), to the input of the read amplifier (AMPL).

Furthermore, a transistor (MN3) controlled by a signal (SB) is connected to the node (N1) and to ground. The output stage (OUT) comprises a MOSFET transistor of the N type (MN7) whose gate is connected to the node (N1). The source of the transistor (MN7) is connected to ground and its drain to a current generator (Iref2) via a node (N2). The current (Iref2) is generated in such a manner as to be positive incoming onto the node (N2).

The input of two inverters (Inv1) and (Inv2) in series is connected to the node (N2) and the output of the inverters forms the output of the read amplifier (AMPL), delivering the signal (DAT).

Furthermore, a transistor of the P type (MP1), controlled by a signal (RD) is connected to a stable positive voltage source (Vdd) and to the node (N2). The signals (SB) and (RD) are generated by the read circuit MLEC.

During a wait phase, the read amplifier (AMPL) is inactive, the voltage of the input node (BUSR) is floating, and the current sources are turned off. The signal (RD) is at "0", so that the input of the inverters in series is forced to Vdd and is not therefore floating, the output signal (DAT) then being equal to "1". The signal (SB) is at "1", so that the feedback loop (BCL) is "short-circuited" in order for the voltage of the node (BUSR) of the read amplifier (AMPL)

to be floating, with the aim of limiting the power consumption. The read phase is preceded by a pre-charge phase, during which the read amplifier (AMPL) is active and pre-charges the node (BUSR) to a pre-charge voltage.

When the bit line (BL) is not selected, the current source (Iref3) applied to the node (BUSR) tends to make the voltage of the node (BUSR) fall below the threshold voltage of the transistor (MN1). The transistor (MN1) is turned off, the voltage on the node (N1) increases by the action of the current source (Iref1) connected to a stable positive voltage source (Vdd). The transistor (MN7) is then turned on but the voltage at the node (N2) is held at Vdd by the conducting transistor (MN1). The source follower configuration of the transistor (MN2) transmits an increasing voltage over the node (BUSR) until it reaches the threshold voltage of the transistor (MN1), then making the voltage of the node (N1) decrease. As a consequence, the voltage transmitted over the node (BUSR) by the source follower configuration of the transistor (MN2) decreases in the same way until it reaches a stable situation.

This mechanism of the feedback loop (BLC) is stabilized when the voltage at the node (BUSR) is at the threshold voltage of the transistor (MN1). The pre-charge voltage therefore has the value of the threshold voltage of the transistor (MN1), for example, substantially equal to 800 mV. The controller (MCOM) selects the bit line (BL) by rendering the transistor (MN4) conducting via a positive voltage (COL), and the selected bit line (BL) is also pre-charged at the pre-charge voltage. The signal (RD) is at "0" and (DAT) is still equal to "1". During the read phase, the controller (MCOM) conventionally selects a memory cell by applying a positive voltage to the word line (WL) and by maintaining the transistor (MN4) in the conducting state.

A voltage higher than the pre-charge voltage, for example, substantially equal to 1.4V, is applied to the source lines (SL), and a positive reference potential is applied to the control gate (CG). Advantageously, the reference potential applied to the control gate (CG) is such that a virgin cell, in other words not carrying any charge in the floating gate of the state transistor, would deliver a voltage on the bit line (BL) equal to the pre-charge voltage if this reference voltage were applied to the control gate (CG) of its state transistor.

The reference voltage may, for example, be equal to 1.9V, but may also be equal to the voltage applied to the source line (SL). The current sources of the read amplifier (AMPL) are kept active, and the signals (RD) and (SB) are respectively equal to "1" and "0". The voltage at the node (N2) is then generated by the voltage source (Vdd) via the current source (Iref2) and depends on the conducting or non-conducting state of the transistor (MN7).

The current source (Iref3) imposes a current to ground on the pre-charge/bit-line feedback loop assembly. The bit line (BL) indeed needs to be pulled down to ground in order to be able to test the conduction state of the memory cell. A memory cell in the erased state is non-conducting. The mechanism of the feedback loop (BCL) previously described will bring the voltage of the node (BUSR) back to the level of the pre-charge voltage.

The voltage of the node (N1) will increase in the course of this mechanism and render the transistor (MN7) conducting, making the voltage of the node (N2) drop. The signal (DAT) then goes to "0". A memory cell in the programmed state is conducting and will transmit the voltage of the source line (SL) to the bit line (BL) and thus make the voltage of the node (BUSR) increase significantly. The transistor (MM) will be highly conducting, and will make the voltage at the node (N1) drop and turn the transistor (MN7) off. The voltage of the node (N2) then increases under the effect of the voltage source (Vdd) via the current source (Iref2) and the signal (DAT) then goes to "1".

In this embodiment, the read operation is carried out by detection of a variation in voltage, but it may notably be envisaged to detect a variation in current. In the read phase, a read current flows from the memory cell towards the input node (BUSR) of the read amplifier (AMPL), and this read current cannot be higher than the current imposed by the current source (Iref3). Thus, the current source (Iref3) may be configured for generating a current of low intensity, for example, substantially equal to 1 µA, allowing the invention to be adapted to systems with low power consumption.

Furthermore, the range of voltages on the bit line (BL) is limited by the threshold voltage of the transistor (MM) to the minimum and by the voltage applied to the source line (SL) to the maximum, also allowing the invention to be used in systems with low power consumption. It turns out that, during the read operation, no current leakage due to a ground potential on a drain or a source of a transistor of the memory cells is able to interfere with the read current of the bit line. This advantageous result comes notably from the introduction of the substrate effect (in other words the low level of the electrodes of the transistors is higher than ground) into all the possible passages of the current leaks. It then becomes possible to reduce the lengths of the state and selection transistors of the memory cells, and also the space between two neighbouring bit lines of a memory plane, without compromising the functionality of the memory owing to excessive current leaks.

By way of illustrative example, the present invention allows the surface areas of the memory cells currently used to be reduced by close to 50%.

Furthermore, the invention is not limited to the embodiment previously described but encompasses all its variants. For example, the output stage could comprise a differential amplifier, and the pre-charge voltage could be formed and maintained by any other means.

What is claimed is:

1. A memory device comprising a read amplifier, the read amplifier comprising:
    a first current generator and a second current generator;
    a first inverter having an input coupled to an output of the second current generator;
    a first transistor having a gate node coupled to an input node of the read amplifier, a drain node coupled to an output of the first current generator, and a source node coupled to a reference ground;
    a second transistor having a gate node coupled to the output of the first current generator, a drain node coupled to a reference voltage, and a source node coupled to the gate node of the first transistor;
    a third transistor having a drain node coupled to the output of the first current generator and a source node coupled to the reference ground;
    a fourth transistor having a gate node coupled to the output of the first current generator, a drain node coupled to the output of the second current generator, and a source node coupled to the reference ground; and
    a fifth transistor having a drain node coupled to the output of the second current generator and a source node coupled to the reference voltage.

2. The memory device of claim 1, wherein the read amplifier further comprises a second inverter having an input coupled to the output of the first inverter.

3. The memory device of claim 2, wherein the output of the second inverter is the output of the read amplifier.

4. The memory device of claim 1, wherein each of the first, second, third, and fourth transistors comprise an N-type MOSFET transistor, and wherein the fifth transistor comprises a P-type MOSFET transistor.

5. The memory device of claim 1, further comprising a third current generator coupled to the input of the read amplifier.

6. The memory device of claim 1, further comprising a memory plane, wherein the memory plane comprises a column of memory cells coupled to a bit line, and wherein a select transistor couples the bit line to the input node of the read amplifier.

7. The memory device of claim 6, wherein each memory cell comprises a floating gate transistor coupled in series with a selection transistor, and wherein a body of the selection transistor and a body of the floating gate transistor are coupled to the reference ground.

8. The memory device of claim 6, further comprising a pre-charge circuit coupled to the bit line.

9. The memory device of claim 6, further comprising a controller with an output coupled to a gate of the select transistor.

10. A memory device comprising a read amplifier, the read amplifier comprising:
   a first current generator and a second current generator;
   a first transistor having a gate node coupled to an input node of the read amplifier, a drain node coupled to an output of the first current generator, and a source node coupled to a reference ground;
   a second transistor having a gate node coupled to the output of the first current generator, a drain node coupled to a reference voltage, and a source node coupled to the gate node of the first transistor;
   a third transistor having a drain node coupled to the output of the first current generator and a source node coupled to the reference ground; and
   a fourth transistor having a gate node coupled to the output of the first current generator, a drain node coupled to the output of the second current generator, and a source node coupled to the reference ground.

11. The memory device of claim 10, further comprising a fifth transistor having a drain node coupled to the output of the second current generator and a source node coupled to the reference voltage.

12. The memory device of claim 10, further comprising:
   a fifth transistor having a drain node coupled to the output of the second current generator and a source node coupled to the reference voltage;
   a first inverter having an input coupled to an output of the second current generator; and
   a second inverter having an input coupled to the output of the first inverter.

13. The memory device of claim 12, wherein the output of the second inverter is the output of the read amplifier.

14. The memory device of claim 10, further comprising a memory plane, wherein the memory plane comprises a column of memory cells coupled to a bit line, and wherein a select transistor couples the bit line to the input node of the read amplifier.

15. The memory device of claim 14, further comprising:
   a pre-charge circuit coupled to the bit line; and
   a controller with an output coupled to a gate of the select transistor.

16. A memory device comprising a read amplifier, the read amplifier comprising:
   a first current generator, a second current generator, and a third current generator;
   a first transistor having a gate node coupled to an input node of the read amplifier and the third current generator, a drain node coupled to an output of the first current generator, and a source node coupled to a reference ground;
   a second transistor having a gate node coupled to the output of the first current generator, a drain node coupled to a reference voltage, and a source node coupled to the gate node of the first transistor; and
   a third transistor having a drain node coupled to the output of the first current generator and a source node coupled to the reference ground.

17. The memory device of claim 16, further comprising a memory plane, wherein the memory plane comprises a column of memory cells coupled to a bit line, and wherein a select transistor couples the bit line to the input node of the read amplifier.

18. The memory device of claim 17, wherein the memory plane further comprises an input node coupled to the reference voltage.

19. The memory device of claim 16, further comprising:
   a fourth transistor having a gate node coupled to the output of the first current generator, a drain node coupled to the output of the second current generator, and a source node coupled to the reference ground;
   a fifth transistor having a drain node coupled to the output of the second current generator and a source node coupled to the reference voltage;
   a first inverter having an input coupled to an output of the second current generator; and
   a second inverter having an input coupled to the output of the first inverter.

20. The memory device of claim 19, wherein the output of the second inverter is the output of the read amplifier.

* * * * *